(12) United States Patent
Liu et al.

(10) Patent No.: US 11,360,160 B2
(45) Date of Patent: Jun. 14, 2022

(54) ELECTRONIC DEVICE

(71) Applicant: HUAWEI TECHNOLOGIES CO., LTD., Shenzhen (CN)

(72) Inventors: Qingqiu Liu, Shenzhen (CN); Jin Tu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 181 days.

(21) Appl. No.: 16/472,895

(22) PCT Filed: Mar. 15, 2017

(86) PCT No.: PCT/CN2017/076833
§ 371 (c)(1),
(2) Date: Jun. 23, 2019

(87) PCT Pub. No.: WO2018/113108
PCT Pub. Date: Jun. 28, 2018

(65) Prior Publication Data
US 2020/0088810 A1     Mar. 19, 2020

(30) Foreign Application Priority Data

Dec. 23, 2016   (CN) .......................... 201611201917.3

(51) Int. Cl.
*G01R 33/02*     (2006.01)
*G01C 17/28*     (2006.01)
(Continued)

(52) U.S. Cl.
CPC ............. *G01R 33/02* (2013.01); *G01C 17/28* (2013.01); *H04M 1/0277* (2013.01);
(Continued)

(58) Field of Classification Search
CPC ......... G01R 33/02; H05K 2201/10371; H05K 1/181; H05K 9/0026; H05K 9/0075;
(Continued)

(56) References Cited

U.S. PATENT DOCUMENTS

2002/0080593 A1   6/2002   Tsuge et al.
2003/0155913 A1   8/2003   Honkura et al.
(Continued)

FOREIGN PATENT DOCUMENTS

CN   102801872 A   11/2012
CN   203554786 U    4/2014
(Continued)

*Primary Examiner* — Douglas X Rodriguez
*Assistant Examiner* — Trung Q Nguyen
(74) *Attorney, Agent, or Firm* — Rimon PC

(57) ABSTRACT

An electronic device, the electronic device includes: a printed circuit board PCB substrate (201, 31); a magnetometer (202, 32), where the magnetometer (202, 32) is mounted on the PCB substrate (201, 31); and a protection apparatus (203, 33), where the protection apparatus (203, 33) is mounted on the PCB substrate (201, 31) and is disposed at a periphery of the magnetometer (202, 32), and is configured to protect the magnetometer (202, 32). According to the electronic device, sensitivity of the magnetometer (202, 32) can be improved, and the magnetometer (202, 32) can be protected from being damaged.

16 Claims, 7 Drawing Sheets

(51) Int. Cl.
*H04M 1/02* (2006.01)
*H05K 1/18* (2006.01)
*H05K 9/00* (2006.01)

(52) U.S. Cl.
CPC ............ *H05K 1/181* (2013.01); *H05K 9/0026* (2013.01); *H05K 9/0075* (2013.01); *H04M 2250/12* (2013.01); *H05K 2201/10151* (2013.01); *H05K 2201/10371* (2013.01)

(58) Field of Classification Search
CPC ......... H05K 2201/10151; G01C 17/28; H04M 2250/12; H04M 1/0277
USPC ...... 324/252, 200, 207.14–207.18, 219–225, 324/239, 241, 637–639, 600, 500, 529, 324/530, 764.01, 134
See application file for complete search history.

(56) References Cited

U.S. PATENT DOCUMENTS

| | | | |
|---|---|---|---|
| 2012/0072167 A1* | 3/2012 | Cretella, Jr. | .......... G06F 1/1677 702/150 |
| 2013/0317741 A1 | 11/2013 | Brashear et al. | |
| 2014/0125276 A1* | 5/2014 | Lampinen | ............... H02J 50/70 320/108 |
| 2014/0171146 A1 | 6/2014 | Ma et al. | |
| 2014/0218874 A1 | 8/2014 | Malek et al. | |
| 2015/0124402 A1 | 5/2015 | Jang et al. | |
| 2019/0349768 A1* | 11/2019 | Fong | ........................ H04W 4/38 |

FOREIGN PATENT DOCUMENTS

| | | | | |
|---|---|---|---|---|
| CN | 103871706 A | | 6/2014 | |
| CN | 104412728 A | | 3/2015 | |
| CN | 204652784 | * | 9/2015 | ............... H05K 1/18 |
| CN | 204652784 U | * | 9/2015 | ............... H05K 1/18 |
| CN | 204652784 U | | 9/2015 | |
| CN | 204652874 U | * | 9/2015 | ............. A01B 15/04 |
| CN | 105163480 A | | 12/2015 | |
| CN | 205159303 U | | 4/2016 | |
| CN | 105823489 A | | 8/2016 | |
| CN | 106101352 A | | 11/2016 | |

* cited by examiner

ELECTRONIC DEVICE

CROSS-REFERENCE TO RELATED APPLICATIONS

This application is a National Stage of International Application No. PCT/CN2017/076833, filed on Mar. 15, 2017, which claims priority to Chinese Patent Application No. 201611201917.3, filed on Dec. 23, 2016. Both of the aforementioned applications are hereby incorporated by reference in their entireties.

This application claims priority to Chinese Patent Application No. 201611201917.3, filed with the Chinese Patent Office on Dec. 23, 2016 and entitled "ELECTRONIC DEVICE", which is incorporated herein by reference in its entirety.

TECHNICAL FIELD

This application relates to the field of terminals, and more specifically, to an electronic device.

BACKGROUND

A magnetometer (magnetometer) can be used to test a strength and a direction of a magnetic field. Electronic compasses (which are also referred to as electronic compasses) manufactured by using the magnetometer have been widely applied as navigators or posture sensors. Compared with a conventional pointer-type compass and a compass having a gimbal structure, the electronic compass has lower energy consumption, a smaller volume, a lighter weight, and higher precision, and can be miniaturized. An output signal of the electronic compass can be digitally displayed after being processed. Electronic compasses have been widely applied to electronic devices (for example, mobile phones). If the magnetometer is placed at a location that is relatively close to an edge of a printed circuit board (Printed Circuit Board, PCB) substrate, the magnetometer is easily damaged in a process in which the PCB substrate is assembled or carried. Magnetic field interference to and impact of a soft magnetic material on the magnetometer should be avoided as much as possible. To avoid interference from the soft magnetic material, during design of the PCB substrate, high-current devices such as a capacitor and an inductor cannot be arranged around the magnetometer.

In the prior art, to improve reliability, the magnetometer is usually arranged at a location that is relatively distant from the edge of the PCB substrate. However, this results in a problem that the magnetometer is very easily interfered with by a magnetic device on the PCB substrate, affecting sensitivity.

SUMMARY

This application provides an electronic device, to improve sensitivity of a magnetometer and protect the magnetometer from being damaged.

According to a first aspect, an electronic device is provided. The electronic device includes:

a printed circuit board PCB substrate;

a magnetometer, where the magnetometer is mounted on the PCB substrate; and a protection apparatus, where the protection apparatus is mounted on the PCB substrate and is disposed at a periphery of the magnetometer, and the protection apparatus is of a semi-enclosed structure or a fully-enclosed structure and is made of at least one material.

The protection apparatus is introduced to the electronic device of this application, the protection apparatus is mounted on the PCB substrate and is disposed at the periphery of the magnetometer, and the protection apparatus is of the semi-enclosed structure or the fully-enclosed structure and is made of the at least one material, so that the magnetometer can be disposed at a location that is relatively close to an edge of the PCB substrate, thereby improving sensitivity of the magnetometer, and protecting the magnetometer from being damaged.

In some possible implementations, the electronic device further includes:

at least one pad, where the protection apparatus is mounted on the PCB substrate by using the at least one pad.

In some possible implementations, the at least one pad includes a first pad and a second pad, and the first pad and the second pad are respectively located on two sides of the magnetometer.

In some possible implementations, when the protection apparatus is of the semi-enclosed structure, the protection apparatus includes a part protecting the top of the magnetometer and a part protecting a partial side face of the magnetometer.

For example, the protection apparatus is of an arch shape or a rectangular shape.

In some possible implementations, when the protection apparatus is of the semi-enclosed structure, the protection apparatus includes a part protecting a partial side face of the magnetometer or a part protecting an entire side face of the magnetometer.

In some possible implementations, when the protection apparatus is of the fully-enclosed structure, the protection apparatus includes a part protecting the top of the magnetometer and a part protecting an entire side face of the magnetometer.

In some possible implementations, the magnetometer is mounted at a location from which a distance to an edge of the PCB substrate is less than a preset value.

In some possible implementations, the at least one material includes metal that is not easily magnetized or non-metal that is not easily magnetized.

In some possible implementations, the metal that is not easily magnetized is a copper-nickel-zinc alloy.

In some possible implementations, the non-metal is non-metal whose strength is greater than a preset threshold.

A material of the protection apparatus herein is the metal that is not easily magnetized or the non-metal that is not easily magnetized, to ensure that the protection apparatus does not affect a magnetic field environment of the magnetometer.

DESCRIPTION OF EMBODIMENTS

The following describes technical solutions in embodiments of this application with reference to accompanying drawings.

The technical solutions in the embodiments of this application may be applied to an electronic device having a magnetometer. The electronic device may be, but is not limited to, a mobile station, a mobile terminal, a mobile telephone, a mobile phone, a wearable device, a portable device, and the like. The electronic device may communicate with one or more core networks by using a radio access network.

Figure 1:
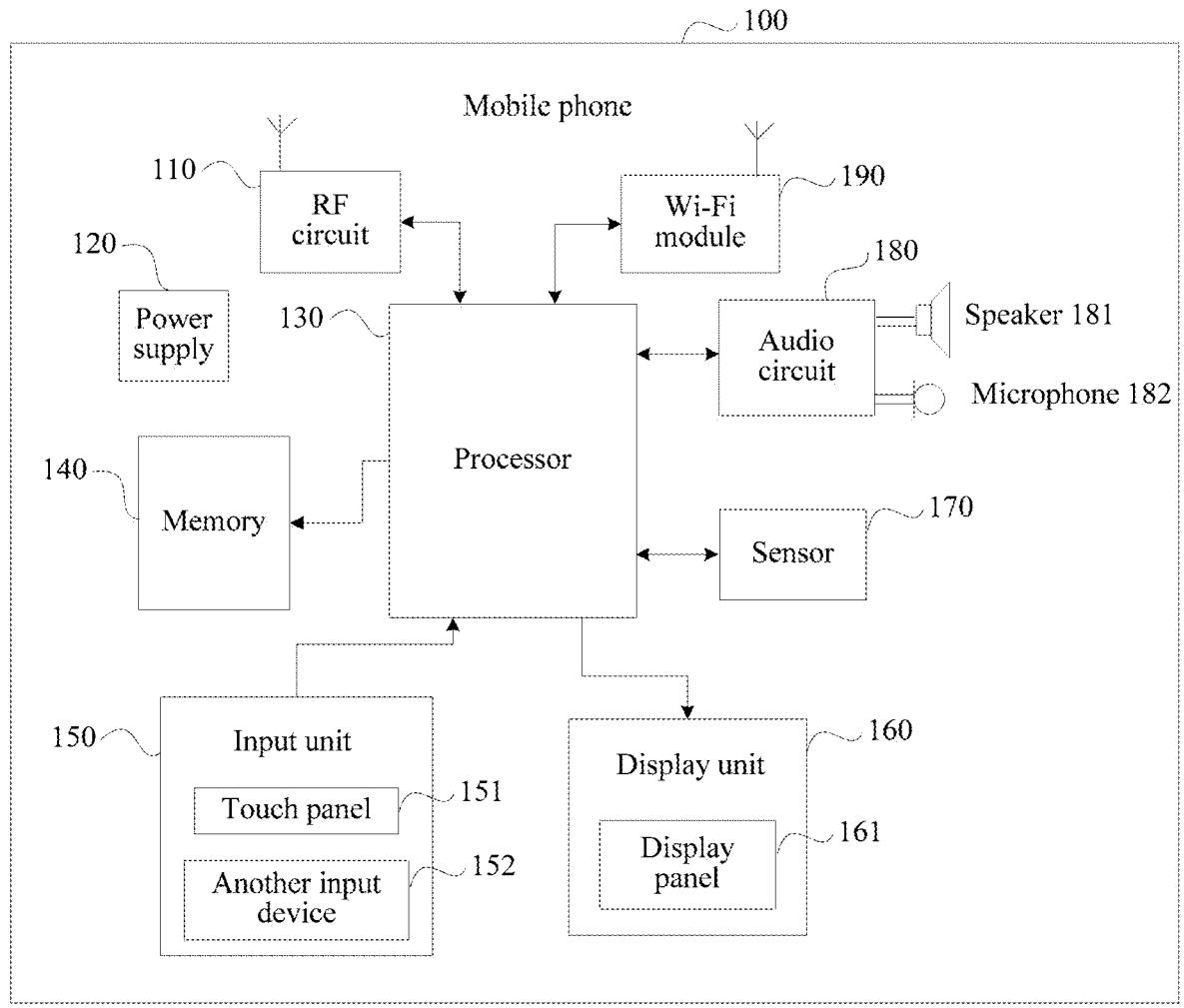
FIG. 1 is a schematic block diagram of a partial structure of a mobile phone related to an embodiment of this application.

An example in which the electronic device is a mobile phone is used below. FIG. 1 is a schematic block diagram of a partial structure of a mobile phone 100 related to an embodiment of this application. As shown in FIG. 1, the mobile phone 100 may include components such as a radio frequency (Radio Frequency, RF) circuit 110, a power supply 120, a processor 130, a memory 140, an input unit 150, a display unit 160, a sensor 170, an audio circuit 180, and a Wireless Fidelity (Wireless Fidelity, Wi-Fi) module 190. It should be understood that a structure of the mobile phone shown in FIG. 1 does not constitute a limitation to the mobile phone, and the mobile phone may include more or fewer components than those shown in the figure, or some components may be combined, or a different component arrangement may be used.

The following specifically describes the components of the mobile phone 100 with reference to FIG. 1.

The RF circuit 110 may be configured to receive and send information or receive and send a signal during a call. Particularly, the RF circuit receives downlink information from a base station, then delivers the downlink information to the processor 130 for processing, and sends designed uplink data to the base station. Usually, the RF circuit includes, but is not limited to, an antenna, at least one amplifier, a transceiver, a coupler, a low noise amplifier (Low Noise Amplifier, LNA), a duplexer, and the like. In addition, the RF circuit 110 may further communicate with another device by using a wireless communications network. The wireless communications network uses at least one communication standard or protocol that has been published or will be subsequently published by at least one communication standard organization. The at least one communication standard organization includes, but is not limited to, the Institute of Electrical and Electronics Engineers (Institute of Electrical and Electronics Engineers, IEEE), the 3rd Generation Partnership Project (The 3rd Generation Partnership Project, 3GPP), the Wireless Broadband Alliance (Wireless Broadband Alliance, WBA), and the Wi-Fi Alliance (Wi-Fi Alliance, WFA).

The memory 140 may be configured to store a software program and a module. The processor 130 runs the software program and the module stored in the memory 140, to execute various functional applications and data processing of the mobile phone 100. The memory 140 may mainly include a program storage area and a data storage area. The program storage area may store an operating system, an application program required by at least one function (such as a sound playback function and an image playback function), and the like. The data storage area may store data (such as audio data and a phone book) created based on use of the mobile phone 100, and the like. In addition, the memory 140 may include a high-speed random access memory, and may further include a non-volatile memory, such as at least one magnetic disk storage device, a flash memory device, or another volatile solid-state storage device.

The input unit 150 may be configured to receive input digit or character information, and generate a key signal input related to a user setting and function control of the mobile phone 100. Specifically, the input unit 150 may include a touch panel 151 and another input device 152. The touch panel 151, which is also referred to as a touchscreen, may collect a touch operation of a user on or near the touch panel 151 (such as an operation of the user on the touch panel 151 or near the touch panel 151 by using any suitable object or accessory such as a finger or a stylus), and drive a corresponding connection apparatus based on a preset program. Optionally, the touch panel 151 may include two parts: a touch detection apparatus and a touch controller. The touch detection apparatus detects a touch position of the user, detects a signal generated by the touch operation, and transfers the signal to the touch controller. The touch controller receives touch information from the touch detection apparatus, converts the touch information into touch point coordinates, and sends the touch point coordinates to the processor 130. Moreover, the touch controller can receive and execute a command sent from the processor 130. In addition, the touch panel 151 may be implemented by using various types, such as a resistive type, a capacitive type, an infrared type, and a surface acoustic wave type. In addition to the touch panel 151, the input unit 150 may further include the another input device 152. Specifically, the another input device 152 may include, but is not limited to, one or more of a physical keyboard, a functional key (such as a volume control key or a switch key), a trackball, a mouse, and a joystick.

The display unit 160 may be configured to display information entered by the user or information provided for the user, and various menus of the mobile phone 100. The display unit 160 may include a display panel 161. Optionally, the display panel 161 may be configured in a form of an LCD or an OLED. Further, the touch panel 151 may cover the display panel 161. After detecting a touch operation on or near the touch panel 151, the touch panel 151 transfers the touch operation to the processor 130, to determine a type of a touch event. The processor 130 then provides a corresponding visual output on the display panel 161 based on the type of the touch event. Although, in FIG. 1, the touch panel 151 and the display panel 151 are used as two separate parts to implement input and input functions of the mobile phone 100, in some embodiments, the touch panel 151 and the display panel 161 may be integrated to implement the input and output functions of the mobile phone 100.

The mobile phone 100 may further include at least one sensor 170, such as an optical sensor, a motion sensor, and another sensor. Specifically, the optical sensor may include an ambient light sensor and a proximity sensor. The ambient light sensor may adjust luminance of the display panel 161 depending on brightness of the ambient light. The proximity sensor may switch off the display panel 161 and/or backlight when the mobile phone 100 is moved to the ear. As one type of motion sensor, an acceleration sensor may detect magnitude of accelerations in various directions (generally on three axes), may detect magnitude and a direction of gravity when static, and may be applied to a mobile phone posture recognition application (such as switching between horizontal and vertical screens, a related game, and magnetometer posture calibration), a function related to vibration recognition (such as a pedometer and a knock), and the like. Other sensors such as a gyroscope, a barometer, a hygrometer, a thermometer, and an infrared sensor, which may be configured in the mobile phone 100, are not further described herein.

The audio circuit 180, a speaker 181, and a microphone 182 may provide audio interfaces between the user and the mobile phone 100. The audio circuit 180 may convert received audio data into an electrical signal and transmit the electrical signal to the speaker 181. The speaker 181 converts the electrical signal into a sound signal for output. In addition, the microphone 182 converts a collected sound signal into an electrical signal. The audio circuit 180 receives the electrical signal, converts the electrical signal into audio data, and outputs the audio data to the RF circuit 110 to send the audio data to, for example, another mobile phone, or outputs the audio data to the memory 140 for further processing.

Wi-Fi is a short distance wireless transmission technology. The mobile phone 100 may help, by using the Wi-Fi module 190, the user to receive and send an email, browse a web page, access streaming media, and so on. Wi-Fi provides wireless broadband Internet access for the user. Although FIG. 1C shows the Wi-Fi module 190, it may be understood that the Wi-Fi module 190 is not a necessary component of the mobile phone 100, and when required, the Wi-Fi module 190 may be omitted as long as the scope of the essence of the present invention is not changed.

The processor 130 is a control center of the mobile phone 100, and is connected to various parts of the entire mobile phone by using various interfaces and lines. By running or executing the software program and/or module stored in the memory 140, and invoking the data stored in the memory 140, the processor 130 performs various functions and data processing of the mobile phone 100, thereby implementing various services based on the mobile phone. Optionally, the processor 130 may include one or more processing units. Preferably, the processor 130 may integrate an application processor and a modem processor. The application processor mainly processes an operating system, a user interface, an application program, and the like. The modem processor mainly processes wireless communication. It may be understood that the foregoing modem processor may alternatively not be integrated into the processor 130.

The mobile phone 100 further includes the power supply 120 (such as a battery) supplying power to the components. Preferably, the power supply may be logically connected to the processor 130 by using a power management system, to implement functions such as management of charging, discharging, and energy consumption by using the power management system.

Although not shown in the figure, the mobile phone 100 may further include a camera, a Bluetooth module, and the like.

The electronic device in the embodiments of this application may be applied to the mobile phone 100 shown in FIG. 1, or may be applied to another electronic product having a magnetometer. This is not limited.

Some terms and concepts in the embodiments of this application are briefly described.

For an integrated circuit (Integrated Circuit, IC), an active element (including a transistor, a diode, and the like) and a passive element (including a resistor, a capacitor, and the like) are interconnected based on a particular circuit, and are integrated on a semiconductor single chip, to implement a specific circuit or system function.

A pad (Pad) is a part on which a printed circuit board (Printed Circuit Board, PCB) and a pin of a component are welded to each other, and includes copper foil and a hole.

A magnetometer IC is easily damaged. If the magnetometer IC is placed beside an edge of a PCB substrate, the magnetometer IC is very easily damaged in a process in which the circuit board is assembled or carried. To improve reliability of the magnetometer IC, in the prior art, the magnetometer is arranged at a location that is relatively distant from the edge of the PCB substrate. However, this results in a problem that a large amount of circuit layout space is wasted, and a magnetic field environment of the magnetometer is very easily interfered with by cabling or a magnetic device on the circuit board, affecting sensitivity of the magnetometer.

Figure 2:
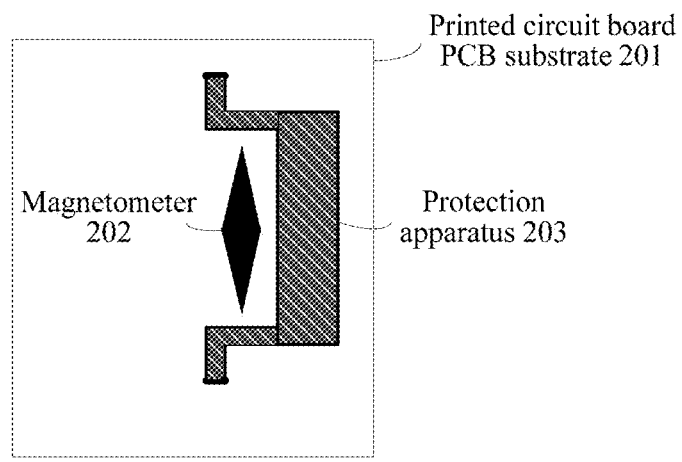
FIG. 2 is a schematic block diagram of an electronic device according to an embodiment of this application.

Based on this, the embodiments of this application intend to provide an electronic device. FIG. 2 is a schematic block diagram of an electronic device according to an embodiment of this application. Herein, a structural diagram shown in FIG. 2 is a side view of the electronic device. It should be understood that introduction of FIG. 2 herein is merely intended to help a person skilled in the art understand the electronic device in the embodiments of this application, but does not constitute a limitation to the embodiments of this application. Optionally, the electronic device in FIG. 2 may be the mobile phone 100 in FIG. 1, or is included in the mobile phone 100 in FIG. 1. This is not limited in this embodiment of this application. As shown in FIG. 2, the electronic device includes:

a printed circuit board PCB substrate 201;

a magnetometer 202, where the magnetometer is mounted on the PCB substrate 201; and a protection apparatus 203, where the protection apparatus 203 is mounted on the PCB substrate 201 and is disposed at a periphery of the magnetometer 202, and the protection apparatus 203 is of a semi-enclosed structure or a fully-enclosed structure and is made of at least one material.

In this embodiment of this application, the PCB substrate 201 is provided with the protection apparatus 203, the protection apparatus 203 is mounted on the PCB substrate 201 and is disposed at the periphery of or around the magnetometer, and the protection apparatus 203 is of the semi-enclosed structure or the fully-enclosed structure and is made of the at least one material, to protect the magnetometer 202, so that a risk that a magnetometer IC is easily damaged in a process in which the circuit board is assembled or carried is reduced.

It should be noted that metal that is not easily magnetized or non-metal that is not easily magnetized may be selected as a material of the protection apparatus 203.

Optionally, the electronic device further includes:

at least one pad, where the protection apparatus 203 is mounted on the PCB substrate 201 by using the at least one pad.

That is, the PCB substrate 201 may be provided with the at least one pad, and the protection apparatus may be mounted on the PCB substrate 201 by using the at least one pad. For example, the protection apparatus may be welded on the PCB substrate 201 in a surface-mount form.

Optionally, in an embodiment, the at least one pad may include a first pad and a second pad, and the first pad and the second pad are respectively located on two sides of the magnetometer. For example, the protection apparatus 203 may be mounted at the periphery of the magnetometer 202 by using an upper pad and a lower pad.

It should be understood that the protection apparatus 203 may use one or more pads, provided that the protection apparatus 203 can be normally mounted. This is not limited in this embodiment of this application.

Optionally, in an embodiment, when the protection apparatus 203 is of the semi-enclosed structure, the protection apparatus 203 may include a part protecting the top of the magnetometer 202 and a part protecting a partial side face of the magnetometer 202.

For example, the protection apparatus 203 surrounds a part of four sides of the magnetometer 202, and covers the top of the magnetometer 202.

For another example, two sides of the protection apparatus 203 are opened. For example, the protection apparatus 203 is of a proper shape such as an arch shape or a rectangular shape.

Optionally, in an embodiment, when the protection apparatus 203 is of the semi-enclosed structure, the protection apparatus includes a part protecting a partial side face of the magnetometer or a part protecting an entire side face of the magnetometer.

That is, the protection apparatus 203 does not include a part protecting the top of the magnetometer 202.

For example, the protection apparatus 203 surrounds four sides of the magnetometer 202; or the protection apparatus 203 surrounds a part of four sides of the magnetometer, or the protection apparatus 203 is disposed on two sides of four sides of the magnetometer.

Optionally, in an embodiment, when the protection apparatus 203 is of the fully-enclosed structure, the protection apparatus 203 may include a part protecting the top of the magnetometer 202 and a part protecting an entire side face of the magnetometer 202.

For example, the protection apparatus 203 surrounds four sides of the magnetometer 202, and includes the part protecting the top of the magnetometer 202. For example, the protection apparatus 203 is of a hemispherical shape or another irregular shape, and completely shades the magnetometer 202.

Optionally, the part protecting the top of the magnetometer 202 and the part protecting the entire side face of the magnetometer 202 may be connected or mounted by using some detachable components. For example, the part protecting the top of the magnetometer 202 may be removed as necessary.

Optionally, the part protecting the top of the magnetometer 202 may be a plane, or may be a cover. The part protecting the top of the magnetometer 202 may be disposed above the magnetometer 202 or may cover the magnetometer 202, to more completely protect the magnetometer 202, and protect the magnetometer from being damaged during transferring.

Optionally, in an embodiment, the magnetometer 202 is mounted at a location from which a distance to an edge of the PCB substrate 201 is less than a preset value, to reduce circuit layout space.

For example, the preset value may be 5 millimeters mm.

For example, optionally, an edge location of the PCB substrate 201 may be a location from which a distance to the edge of the substrate is within 5 mm. This layout may create a low magnetic environment for the magnetometer 202, thereby improving sensitivity of the magnetometer 202.

Certainly, the edge location of the PCB substrate 201 may be designed according to a requirement. The edge location of the PCB substrate 201 is defined to be within a proper range when a PCB conceptual diagram is drawn. This is not limited.

Optionally, in this embodiment of this application, the at least one material includes metal that is not easily magnetized or non-metal that is not easily magnetized.

It should be noted that in this embodiment of this application, the material of the protection apparatus 203 is the metal that is not easily magnetized or the non-metal that is not easily magnetized, to ensure that the protection apparatus 203 does not affect a magnetic field environment of the magnetometer 202.

Optionally, the metal that is not easily magnetized may include materials such as copper (for example, a copper-nickel-zinc alloy), silver, aluminum, titanium, tin, and gold.

Optionally, the non-metal that is not easily magnetized may include materials such as ceramic, glass, polypropylene, polyamide, polyoxymethylene, and poly carbonate.

Optionally, the non-metal is non-metal whose strength is greater than a preset value.

Herein, the strength of the non-metal may be defined by a preset strength value, for example, a tensile strength value, a compressive strength, or a preset value of another performance parameter.

Optionally, the material of the protection apparatus 203 may be specifically other metal that is not easily magnetized, for example, a copper-nickel-zinc alloy.

Optionally, in this embodiment of this application, the electronic device may exist in a terminal device or another electronic product. This is not limited.

In addition, the protection apparatus 203 in this embodiment of this application is directly applied to the PCB substrate or a hardware mainboard, to reduce costs.

Therefore, the protection apparatus is introduced to the electronic device in this embodiment of this application, and the protection apparatus is mounted on the PCB substrate and is disposed at the periphery of the magnetometer, and is configured to protect the magnetometer, so that the circuit layout space is reduced, the sensitivity of the magnetometer is improved, the magnetometer is protected from being damaged, and the costs are relatively low.

Figure 3:
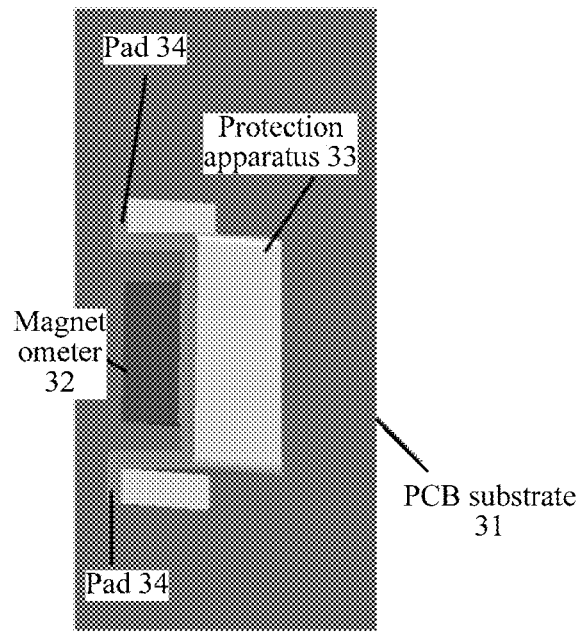
FIG. 3 is a schematic diagram of an example according to an embodiment of this application.

FIG. 3 is a schematic diagram of an example according to an embodiment of this application. As shown in FIG. 3, a magnetometer 32 is mounted on a PCB substrate 31. A protection apparatus 33 is of an arch shape, is mounted on the PCB substrate 31, and disposed at a periphery of the magnetometer 32, and is configured to protect the magnetometer 32 from being damaged due to collision. Specifically, the protection apparatus 33 may be mounted on the PCB substrate 31 by using upper and lower pads 34. The two pads 34 are respectively located on upper and lower sides of the magnetometer. In this way, the protection apparatus 33 protects the magnetometer 32 from being damaged due to collision without affecting a magnetic field environment of the magnetometer 32.

Figure 4:
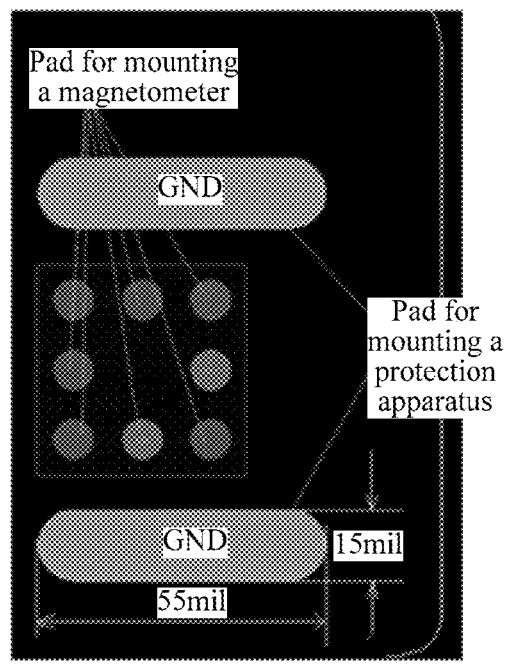
FIG. 4 is an example of a PCB conceptual diagram according to an embodiment of this application.

In the electronic device in this embodiment of this application, for mounting of the protection apparatus, a PCB conceptual diagram of the protection apparatus may be first designed. For example, at least one pad may be designed at the periphery of the magnetometer, and is configured to mount the protection apparatus. FIG. 4 is an example of a PCB conceptual diagram according to an embodiment of this application. As shown in FIG. 4, "pads for mounting a protection apparatus" are respectively located on two sides of "pads for mounting a magnetometer". It should be understood that FIG. 4 is an example of a PCB plan drawing, and does not constitute a limitation to the embodiments of this application.

Optionally, during specific implementation, the PCB conceptual diagram may be designed by using circuit aid software, such as protel99se. This is not limited.

Figure 9:
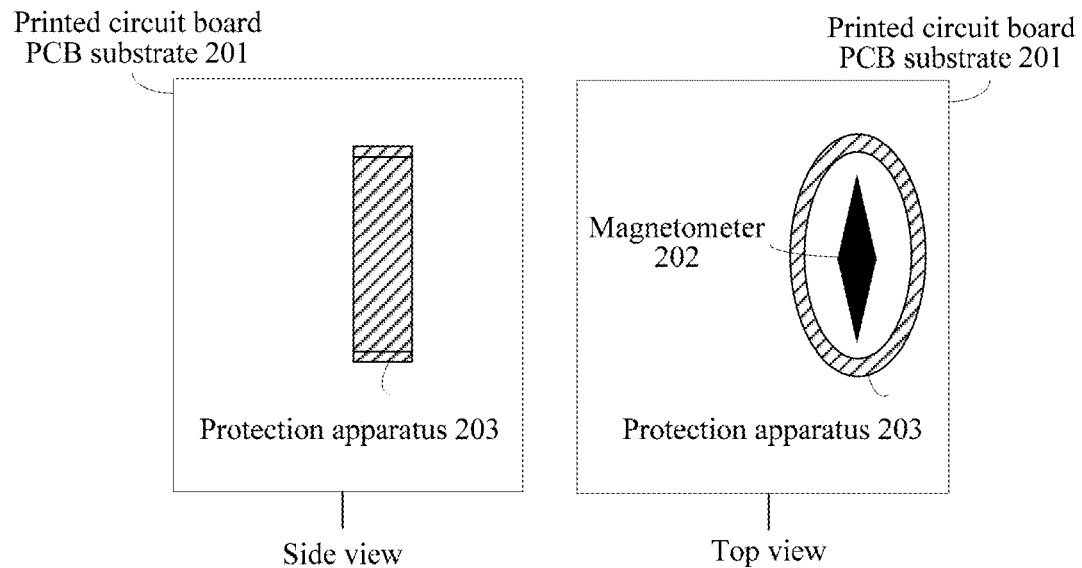
FIG. 9 is a schematic block diagram of an example according to an embodiment of this application.
Figure 10:
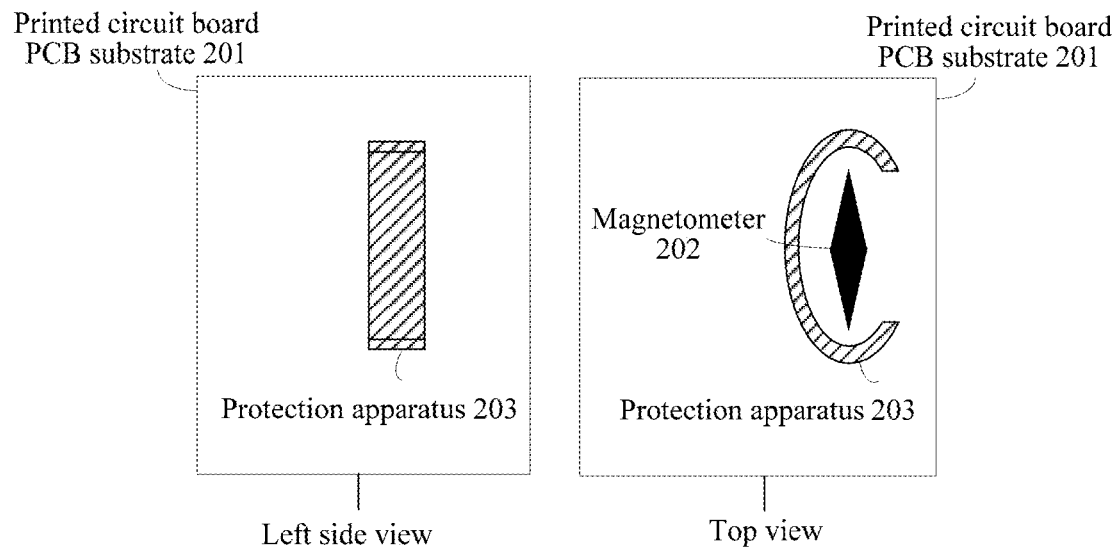
FIG. 10 is a schematic block diagram of an example according to an embodiment of this application.
Figure 11:
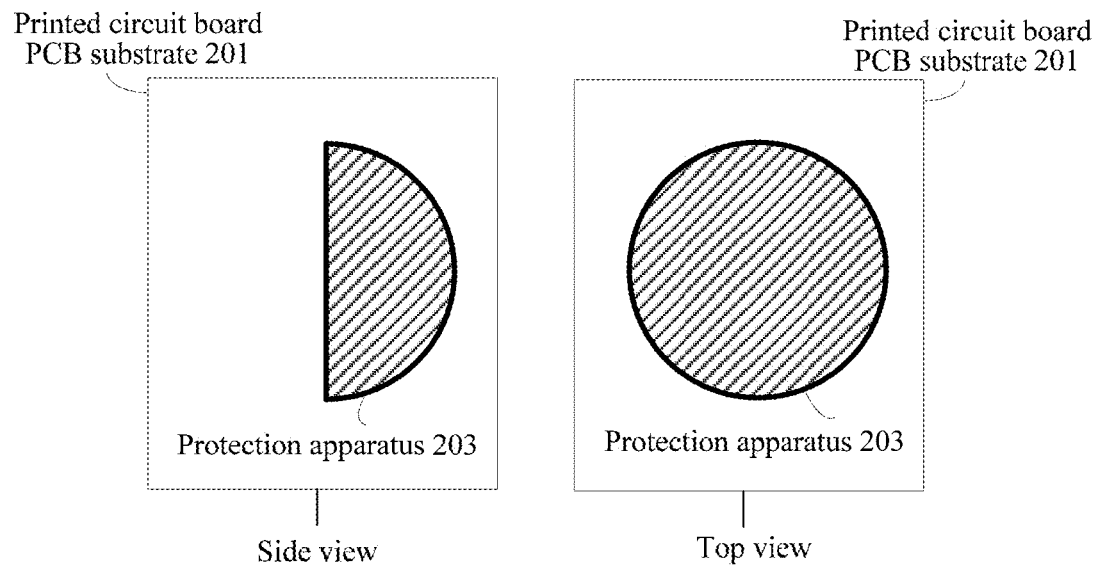
FIG. 11 is a schematic block diagram of an example according to an embodiment of this application.
Figure 12:
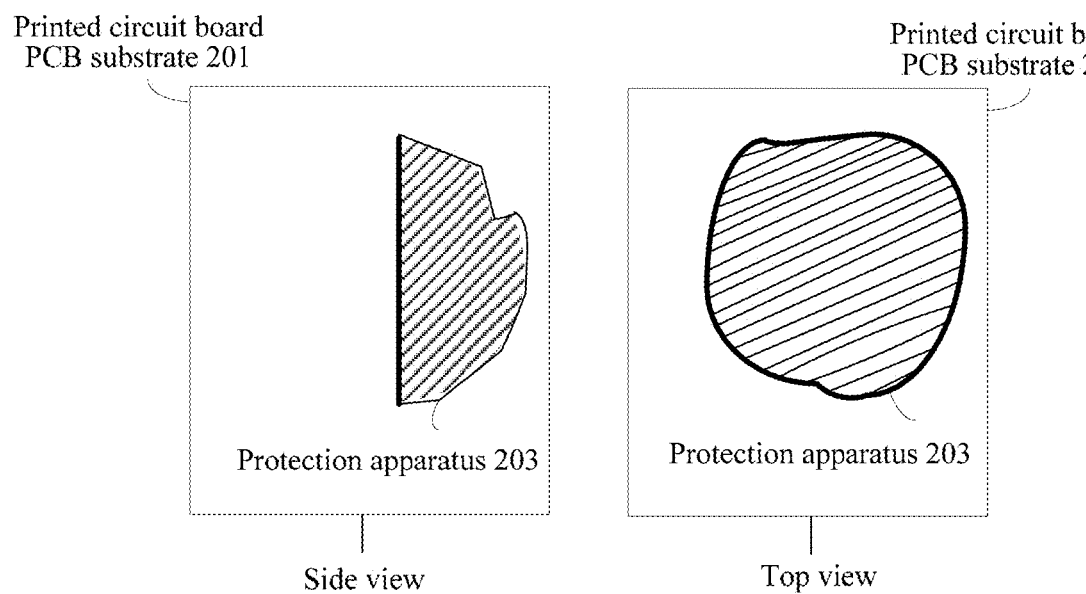
FIG. 12 is a schematic block diagram of an example according to an embodiment of this application.
Figure 13:
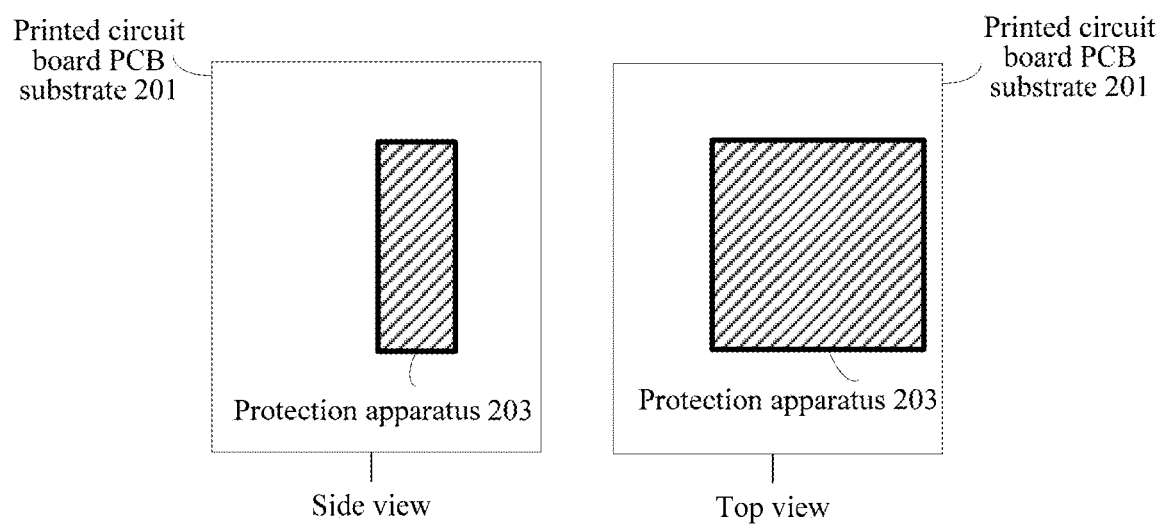
FIG. 13 is a schematic block diagram of an example according to an embodiment of this application.

The following describes a structure of the protection apparatus in the embodiments of this application with reference to examples in FIG. 5 to FIG. 13. It should be understood that FIG. 5 to FIG. 13 show some variations made to the protection apparatus 203 in FIG. 2, the descriptions are only examples herein, and do not constitute limitation to the embodiments of this application. The protection apparatus in FIG. 5 to FIG. 10 is of a semi-enclosed structure, and the protection apparatus in FIG. 11 to FIG. 13 is of a fully-enclosed structure.

Figure 5:
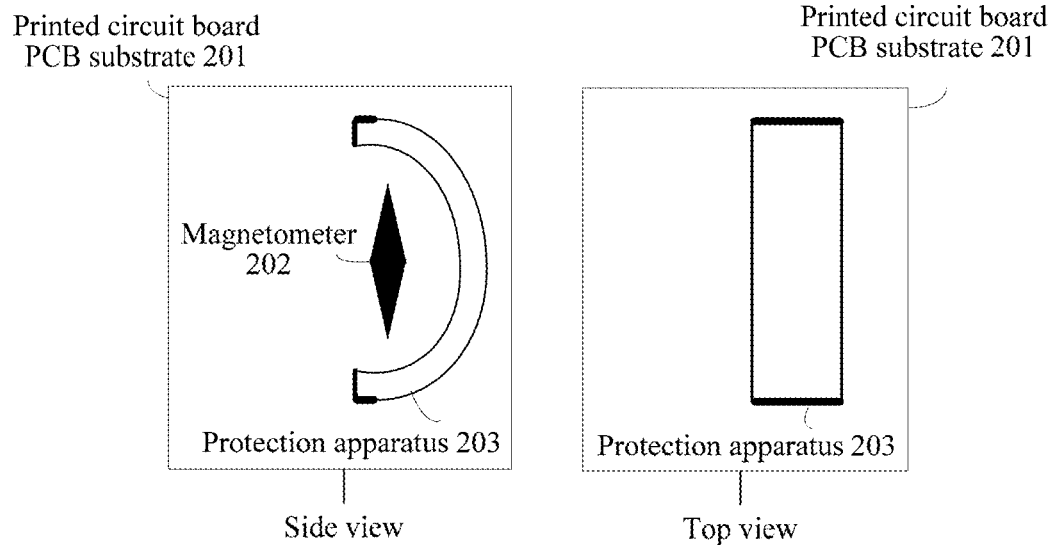
FIG. 5 is a schematic block diagram of an example according to an embodiment of this application.

FIG. 5 is a schematic block diagram of an example according to an embodiment of this application. As shown in FIG. 5, the protection apparatus 203 may be of a regular arch-shaped structure. It may be learned from a side view in FIG. 5 that two sides of the protection apparatus 203 are opened. It may be learned from a top view in FIG. 5 that the protection apparatus 203 covers the top of the magnetometer 202.

Figure 6:
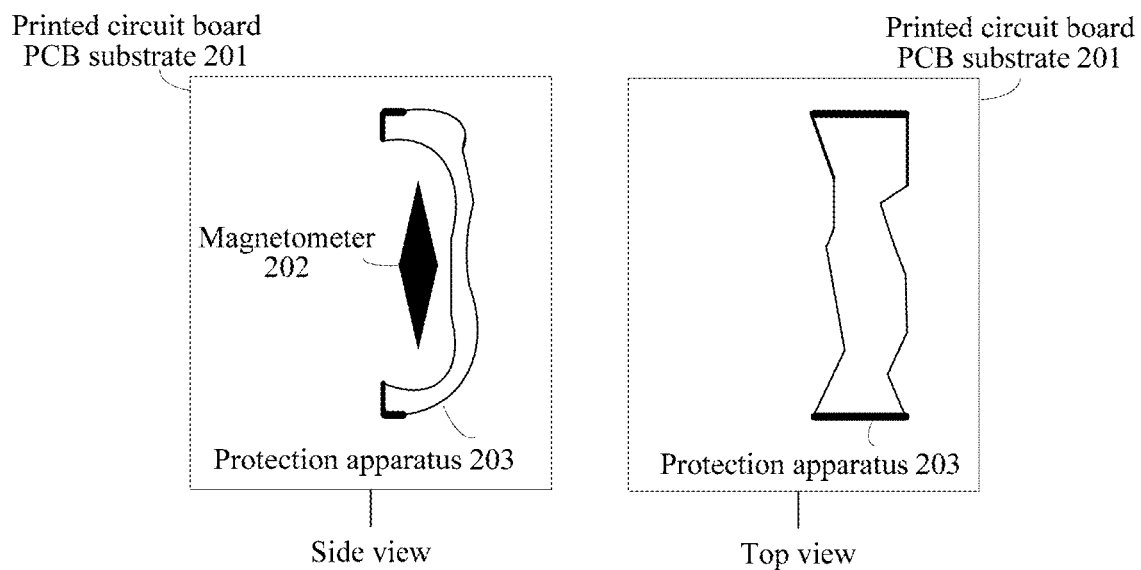
FIG. 6 is a schematic block diagram of an example according to an embodiment of this application.

FIG. 6 is a schematic block diagram of an example according to an embodiment of this application. As shown in FIG. 6, the protection apparatus 203 may be of an irregular arch-shaped structure. It may be learned from a side view in FIG. 6 that two sides of the protection apparatus 203 are opened. It may be learned from a top view in FIG. 6 that the protection apparatus 203 covers the top of the magnetometer 202.

Figure 7:
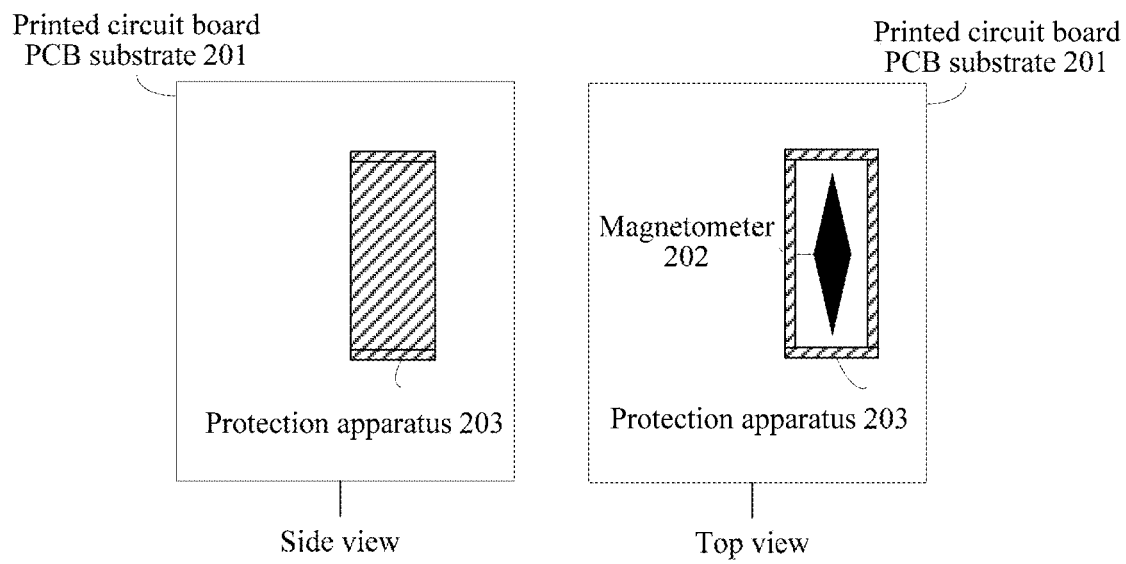
FIG. 7 is a schematic block diagram of an example according to an embodiment of this application.

FIG. 7 is a schematic block diagram of an example according to an embodiment of this application. As shown in FIG. 7, the protection apparatus 203 may be of a semi-enclosed structure surrounding four sides of the magnetometer 202. It may be learned from a side view in FIG. 7 that the protection apparatus 203 surrounds a side face of the magnetometer. It may be learned from a top view in FIG. 7 that the protection apparatus 203 surrounds the four sides of the magnetometer 202 but does not cover the top of the magnetometer 202.

Figure 8:
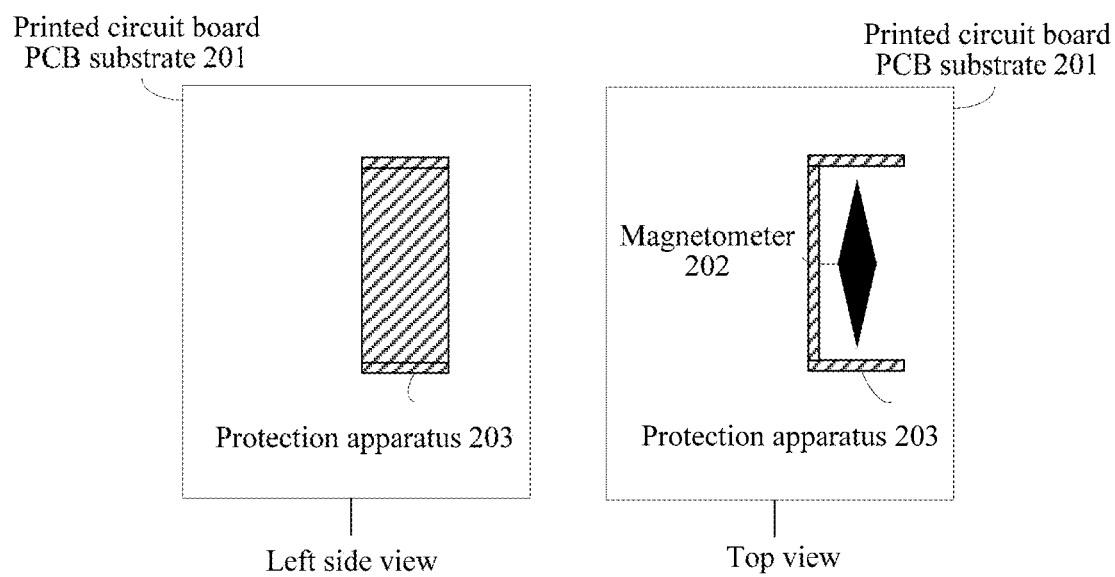
FIG. 8 is a schematic block diagram of an example according to an embodiment of this application.

FIG. 8 is a schematic block diagram of an example according to an embodiment of this application. As shown in FIG. 8, the protection apparatus 203 may be of a semi-enclosed structure surrounding three sides of the magnetometer 202. It may be learned from a left side view in FIG. 8 that the protection apparatus 203 surrounds a partial side face of the magnetometer 202. It may be learned from a top view in FIG. 8 that the protection apparatus 203 surrounds the three sides of the magnetometer 202 but does not cover the top of the magnetometer 202.

FIG. 9 is a schematic block diagram of an example according to an embodiment of this application. As shown in FIG. 9, the protection apparatus 203 may be of a semi-enclosed structure surrounding an entire periphery of the magnetometer. It may be learned from a side view in FIG. 9 that the protection apparatus 203 surrounds a side face of the magnetometer. It may be learned from a top view in FIG. 9 that the protection apparatus 203 is of an ellipse shape (which may also be another shape herein and is not limited) and surrounds the magnetometer 202 but does not cover the top of the magnetometer 202.

FIG. 10 is a schematic block diagram of an example according to an embodiment of this application. As shown in FIG. 10, the protection apparatus 203 may be of a semi-enclosed structure surrounding a partial periphery of the magnetometer 202. It may be learned from a left side view in FIG. 10 that the protection apparatus 203 surrounds a side face of the magnetometer 202. It may be learned from a top view in FIG. 10 that the protection apparatus 203 is of a partial ellipse shape (which may also be another shape herein and is not limited) and surrounds the partial periphery of the magnetometer 202 but does not cover the top of the magnetometer 202.

FIG. 11 is a schematic block diagram of an example according to an embodiment of this application. As shown in FIG. 11, the protection apparatus 203 may be of a fully-enclosed spherical structure shading the magnetometer (not shown). It may be learned from a side view in FIG. 11 that the protection apparatus 203 shades a side face of the magnetometer. It may be learned from a top view in FIG. 11 that the protection apparatus 203 is of a semicircular shape (which may also be another shape herein and is not limited) and shades the magnetometer, and covers the top of the magnetometer.

FIG. 12 is a schematic block diagram of an example according to an embodiment of this application. As shown in FIG. 12, the protection apparatus 203 may be of a fully-enclosed structure having an irregular shape and shading the magnetometer (not shown). It may be learned from a side view in FIG. 12 that the protection apparatus 203 shades a side face of the magnetometer. It may be learned from a top view in FIG. 12 that the protection apparatus 203 is of the irregular shape (which may also be another shape herein and is not limited) and shades the magnetometer, and covers the top of the magnetometer.

FIG. 13 is a schematic block diagram of an example according to an embodiment of this application. As shown in FIG. 13, the protection apparatus 203 may be of a fully-enclosed cuboid structure shading the magnetometer (not shown). It may be learned from a side view in FIG. 13 that the protection apparatus 203 shades a side face of the magnetometer. It may be learned from a top view in FIG. 11 that the protection apparatus 203 is of the cuboid (which may also be another shape herein and is not limited) structure and shades the magnetometer, and covers the top of the magnetometer.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the embodiments of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in the embodiments of this application, it should be understood that the disclosed system, apparatus, and method may be implemented in other manners. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, that is, may be located in one position, or may be distributed on a plurality of network units. Some or all of the units may be selected based on actual requirements to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions in the embodiments of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations the embodiments of this application, but are not intended to limit the protection scope of the embodiments of this application. Any variation or replacement readily figured out by a person skilled in the art within the technical scope disclosed in the embodiments of this application shall fall within the protection scope the embodiments of this application. Therefore, the protection scope of the embodiments of this application shall be subject to the protection scope of the claims.

What is claimed is:

1. An electronic device, comprising:
   a printed circuit board substrate;
   a magnetometer, wherein the magnetometer is mounted on the printed circuit board substrate; and
   a protection apparatus, wherein the protection apparatus is mounted on the printed circuit board substrate and is disposed at a periphery of the magnetometer;
   forms a discontinuous ring around the magnetometer, is made of at least one material; and
   is configured to protect the magnetometer;
   wherein the electronic device further comprises:
   at least one pad, wherein the protection apparatus is mounted on the printed circuit board substrate by using the at least one pad.

2. The electronic device according to claim 1, wherein the at least one pad comprises a first pad and a second pad, and the first pad and the second pad are respectively located on two sides of the magnetometer.

3. The electronic device according to claim 2, wherein the protection apparatus comprises a part protecting the top of the magnetometer and a part protecting a partial side face of the magnetometer.

4. The electronic device according to claim 3, wherein the protection apparatus comprises a part protecting a partial side face of the magnetometer or a part protecting an entire side face of the magnetometer.

5. The electronic device according to claim 2, wherein the protection apparatus comprises a part protecting a partial side face of the magnetometer or a part protecting an entire side face of the magnetometer.

6. The electronic device according to claim 5, wherein the magnetometer is mounted at a location from which a distance to an edge of the printed circuit board substrate is less than about 5 mm.

7. The electronic device according to claim 2, wherein the magnetometer is mounted at a location from which a distance to an edge of the printed circuit board substrate is less than about 5 mm.

8. The electronic device according to claim 1, wherein the protection apparatus comprises a part protecting the top of the magnetometer and a part protecting a partial side face of the magnetometer.

9. The electronic device according to claim 8, wherein the protection apparatus comprises a part protecting a partial side face of the magnetometer or a part protecting an entire side face of the magnetometer.

10. The electronic device according to claim 1, wherein the protection apparatus comprises a part protecting a partial side face of the magnetometer or a part protecting an entire side face of the magnetometer.

11. The electronic device according to claim 10, wherein the magnetometer is mounted at a location from which a distance to an edge of the printed circuit board substrate is less than about 5 mm.

12. The electronic device according to claim 1, wherein the magnetometer is mounted at a location from which a distance to an edge of the printed circuit board substrate is less than about 5 mm.

13. The electronic device according to claim 1, wherein the magnetometer is mounted at a location from which a distance to an edge of the printed circuit board substrate is less than about 5 mm.

14. The electronic device according to claim 1, wherein the at least one material comprises metal that is not easily magnetized or non-metal that is not easily magnetized.

15. The electronic device according to claim 14, wherein the metal that is not easily magnetized is a copper-nickel-zinc alloy.

16. The electronic device according to claim 14, wherein the non-metal is non-metal whose strength is greater than a preset threshold.

* * * * *

UNITED STATES PATENT AND TRADEMARK OFFICE
CERTIFICATE OF CORRECTION

PATENT NO. : 11,360,160 B2
APPLICATION NO. : 16/472895
DATED : June 14, 2022
INVENTOR(S) : Qingqiu Liu et al.

Page 1 of 1

It is certified that error appears in the above-identified patent and that said Letters Patent is hereby corrected as shown below:

On the Title Page

In item (57), in Column 2, in "Abstract", Line 2, delete "PCB" and insert -- (PCB) --.

In the Specification

In Column 1, Lines 13-17, below "reference in their entireties." delete "This application claims priority to Chinese Patent Application No. 201611201917.3, filed with the Chinese Patent Office on Dec. 23, 2016 and entitled "ELECTRONIC DEVICE", which is incorporated herein by reference in its entirety."

Signed and Sealed this
Sixth Day of September, 2022

Katherine Kelly Vidal
*Director of the United States Patent and Trademark Office*